(12) United States Patent
Morishima

(10) Patent No.: US 7,795,964 B2
(45) Date of Patent: Sep. 14, 2010

(54) SIGNAL GENERATING APPARATUS AND CLASS-D AMPLIFYING APPARATUS

(75) Inventor: Morito Morishima, Fukuroi (JP)

(73) Assignee: Yamaha Corporation, Hamamatsu-shi (JP)

(*) Notice: Subject to any disclaimer, the term of this patent is extended or adjusted under 35 U.S.C. 154(b) by 83 days.

(21) Appl. No.: 12/317,207

(22) Filed: Dec. 19, 2008

(65) Prior Publication Data

US 2009/0160513 A1    Jun. 25, 2009

(30) Foreign Application Priority Data

Dec. 20, 2007  (JP) .............................. 2007-328273

(51) Int. Cl.
*H03F 3/38* (2006.01)

(52) U.S. Cl. .................. 330/10; 330/251; 370/212; 375/238

(58) Field of Classification Search .................. 330/10, 330/251; 370/212; 375/238
See application file for complete search history.

(56) References Cited

U.S. PATENT DOCUMENTS

| | | | | |
|---|---|---|---|---|
| 5,337,230 A | * | 8/1994 | Baumgartner et al. ......... 700/9 |
| 5,353,018 A | * | 10/1994 | McKechnie et al. ..... 340/825.57 |
| 5,615,228 A | * | 3/1997 | Soenen ........................ 375/238 |
| 6,628,221 B2 | * | 9/2003 | Jin .............................. 341/152 |
| 2006/0208793 A1 | | 9/2006 | Morishima |
| 2008/0278984 A1 | * | 11/2008 | Stanley ........................ 363/95 |

FOREIGN PATENT DOCUMENTS

JP    2006-262261    9/2006

* cited by examiner

*Primary Examiner*—Patricia Nguyen
(74) *Attorney, Agent, or Firm*—Pillsbury Winthrop Shaw Pittman LLP

(57) ABSTRACT

A time period control unit controls a time length "TU" of each of unit terms "U" in a variable manner. A pulse-width modulating unit is arranged by a holding unit, a counting unit, and a waveform generating unit. The holding unit holds thereinto a plurality of data "XD" every unit term "U", which are sequentially supplied, as data "XE." The counting unit changes a count value "X" during each of the unit terms "U." The waveform generating unit generates such a pulse-width modulating signal "S" that pulses "P" have been arranged every unit term "U", while time points when a large/small relationship between the count value "C" and a numeral value of the data "XE" held by the holding unit is inverted are defined as edge portions of the pulses.

6 Claims, 6 Drawing Sheets

SIGNAL GENERATING APPARATUS AND CLASS-D AMPLIFYING APPARATUS

BACKGROUND OF THE INVENTION

The present invention is related to a technique for generating signals (will be referred to as "pulse-width modulation signals" hereinafter), the pulse widths of which have been set in response to a time sequence of a plurality of data.

Signal generating apparatuses (PWM modulation circuits) which produce pulse-width modulation signals from time sequences of digital-formatted data are suitably utilized in, for example, class-D amplifying apparatuses. JP-A-2006-262261 has disclosed the following technical idea: That is, while sections during which the numeral values of the respective data exceed the carrier signals formed by count values generated from the counter circuit are defined as the pulse widths, the pulse-width modulation signals are generated. The carrier signals are such sawtooth signals, the amplitudes of which are increased, or decreased at the predetermined frequency.

However, in the arrangements disclosed in JP-A-2006-262261, the strengths of the signal components corresponding to the frequency of the carrier signals within the pulse-width modulation signals become conspicuous. As a result, there is such a problem of electro magnetic interference (EMI) caused by the above-described signal components. The present invention has been made by considering the above-described problem, and therefore, has an object to provide a technical idea capable of suppressing the electro magnetic interference caused by the pulse-width modulation.

SUMMARY OF THE INVENTION

In order to solve the above-described problem, a signal generating apparatus according to the present invention includes:

a time period controller which variably controls a time length of each of unit terms;

a counter which changes a count value during each of the unit terms;

a holding unit which holds each of plural data every the unit term, the plural data being sequentially supplied; and a waveform generator which generates a pulse-width modulation signal such that a pulse in which a time point when a large/small relationship between the count value and a numeral value of the data held in the holding unit is inverted is defined as an edge portion of the pulse is arranged every the unit term.

In the above-described arrangement, the time length of each of the unit terms within which the pulses of the pulse-width modulation signal are arranged is variably controlled so that the frequency component of the pulse-width modulation signal is spread in a wide frequency range. As a consequence, the electro magnetic interference caused by the pulse-width modulation signal can be suppressed, as compared with such an arrangement that the time length of the unit term has been fixed.

A signal generating apparatus, according to a preferred mode of the present invention, further includes a correcting unit which corrects each of the plural data in such a manner that a duty ratio of the pulse-width modulation signal generated in response to the data after being corrected in each of the unit terms is appropriated to a duty ratio generated in response to data before being corrected during a unit term having a predetermined time length, wherein the holding unit holds the respective data corrected by the correcting unit.

In the above-described arrangement, the attention has been paid to the single unit term. Alternatively, the above-described mode may be specified in view of such an aspect for making duty ratios identical to each other during a plurality of unit terms during which the same data have been designated. In other words, in such a case that a numeral value of data before being corrected, which is held during one unit term, is equal to another numeral value of data before being corrected, which is held during another unit term whose time length is different from the time length of the first-mentioned unit term, the correcting means corrects the respective data in such a manner that a duty ratio of a pulse-width modulation signal during one unit term is made coincident with another duty ratio of a pulse-width modulation signal during another unit term.

In a preferred mode of the present invention, the above-described time period control means includes:

a first setting unit which sets a base value which is commonly used with respect to each of the unit terms;

a second setting unit which variably sets a spread coefficient every the unit term; and a calculator which calculates the time length of each of the unit terms based upon an added value between the base value and the spread coefficient, and wherein the correcting unit includes:

a correction value calculator which calculates a relative ratio of the time length of the unit term with respect to the base value as a correction value of the unit term; and a correction calculator which multiplies each of the plural data by the correction value.

A signal generating apparatus, according to another mode of the present invention, further includes an interpolating unit for calculating data at a starting point of each of the unit terms by an interpolation manner, wherein the holding unit holds the data after being interpolated by the interpolating unit. In the above-described mode, the data at the starting points of the respective unit terms are calculated by the interpolation manner, so that the pulse-width modulation signal capable of representing the waveforms with fidelity can be generated, which are indicated by the respective data.

The signal generating apparatus related to the respective embodiments of the present invention may be suitably employed in a class-D amplifying apparatus. A class-D amplifying apparatus, according to one embodiment of the present invention, is equipped with the signal generating apparatus related to any one of the above-described embodiments; and driving means (for example, driving apparatus 50 of FIG. 1) for controlling a supply of electric power with respect to a load circuit in response to the pulse-width modulation signal.

DETAILED DESCRIPTION OF PREFERRED EMBODIMENTS

A: First Embodiment

Figure 1:
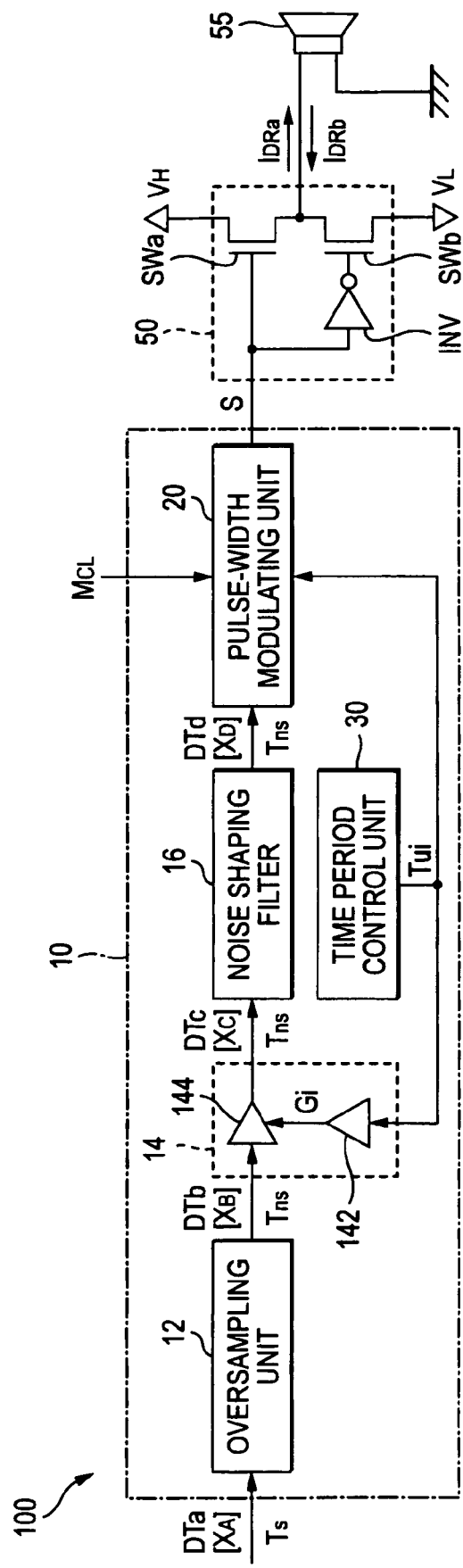
FIG. 1 is a block diagram for showing an arrangement of a class-D amplifying apparatus according to a first embodiment of the present invention.

FIG. 1 is a block diagram for indicating an arrangement of a class-D amplifying apparatus 100 according to a first embodiment of the present invention. As indicated in FIG. 1, the class-D amplifying apparatus 100 is equipped with a signal generating apparatus 10 and a driving apparatus 50. The signal generating apparatus 10 is such an electronic circuit (DSP: Digital Signal Processor) which generates a pulse-width modulation signal "S" based upon data series "DTa" supplied from an upper grade apparatus (not shown). The data series "DTa" corresponds to a time sequence of data "XA" in which waveforms of sounds (voice and musical sounds) on a time axis collected by sound collecting appliances have been acquired in a sampling period "Ts".

The driving apparatus 50 corresponds to a half-bridge type driving circuit which drives a load circuit 55 based upon the pulse-width modulation signal "S". In FIG. 1, such a case that a speaker apparatus is employed as the lord circuit 55 has been exemplified. The driving circuit 50 is arranged by switching elements "SWa" and "SWb", and an inverter circuit "INV". The switching elements "SWa" and "SWb" are N-channel type field-effect transistors which have been series-connected between a high potential-sided power supply "VH" and a low potential-sided power supply "VL". An output terminal of the inverter circuit INV is connected to a gate of the switching element SWb. The pulse-width modulation signal "S" is supplied to both a gate of the switching element SWa of the driving unit 21, and an input terminal of the inverter circuit INV of the driving circuit 21, while the pulse width modulation signal "S" is outputted from the signal generating apparatus 10.

In the above-described arrangement, when a signal level of the pulse-width modulation signal "S" is a high level, since the switching element "SWa" is conducted, a drive current "I DRa" is supplied from the high potential-sided power supply "VH" via the switching element "SWa" to the load circuit 55. On the other hand, when a signal level of the pulse-width modulation signal "S" is a low level, since the switching element "SWb" is conducted, another drive circuit "I DRb" flows from the load circuit 55 via the switching element SWb to the low potential-sided power supply "VL".

As shown in FIG. 1, the signal generating apparatus 10 is equipped with an oversampling unit 12, a correcting unit 14, a noise shaping filter 16, a pulse-width modulating circuit 20, and a time period control unit 30. The oversampling unit 12 performs an oversampling process operation with respect to a data series "DTa" in order to generate a data series "DTb". The data series "DTb" corresponds to a time sequence of data "XB" having a sampling period Tns (Tns<Ts) which is shorter than a sampling period of the data series "DTb". The known techniques are arbitrarily employed in the oversampling process operation.

The correcting unit 14 corrects each data "XB" of the data series "DTb" so as to generate a data series "DTc". The data series "DTc" corresponds to a time sequence (sampling period Tns) of data "XC". It should be understood that a concrete correcting operation by the correcting unit 14 will be described later.

The noise shaping filter 16 executes a noise shaping process operation with respect to the data series "DTc" so as to generate a data series "DTd", while the noise shaping process operation suppresses a quantize noise in an audio range. The data series "DTd" corresponds to a time sequence (sampling period Tns) of data "XD". A bit number of the data XD becomes smaller than a bit number of the data XC of the data series "DTc".

Figure 2:
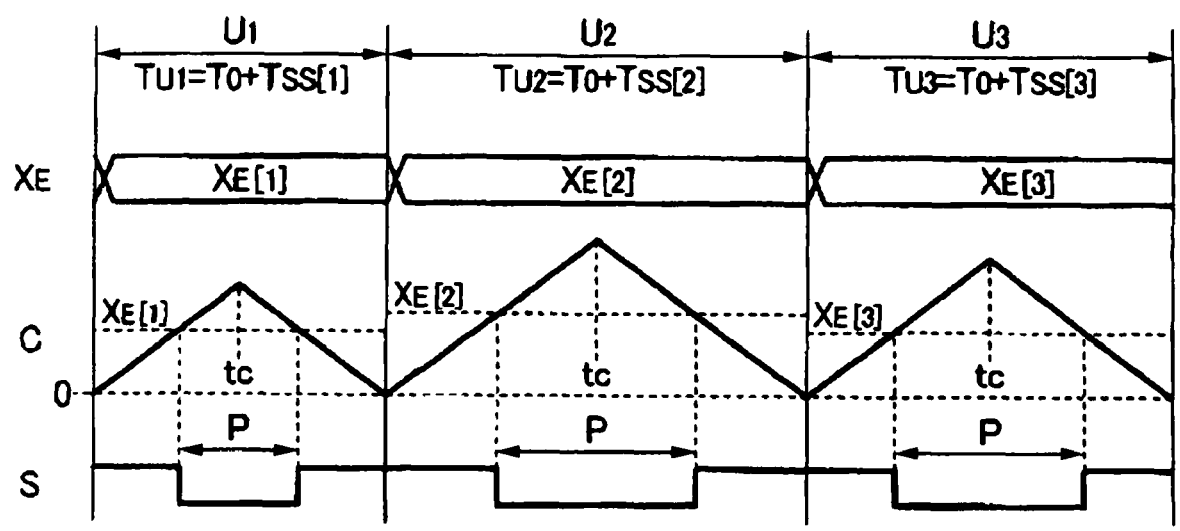
FIG. 2 is a timing chart for describing operation of a signal generating apparatus employed in the class-D amplifying apparatus of FIG. 1.

The pulse-width modulating circuit 20 modulates each data "XD" of the data series "DTd" in the pulse-width modulation manner so as to generate the pulse-width modulation signal "S". FIG. 2 is a timing chart for explaining operations of the signal generating apparatus 10. As represented in FIG. 2, the pulse-width modulation signal "S" is such a signal that a pulse (negative pulse) "P" has been arranged every unit term "U (U1, U2, - - - )". Pulse widths of the respective pulses "P" are controlled in response to the data "XD" of the data series "DTd".

Figure 3:
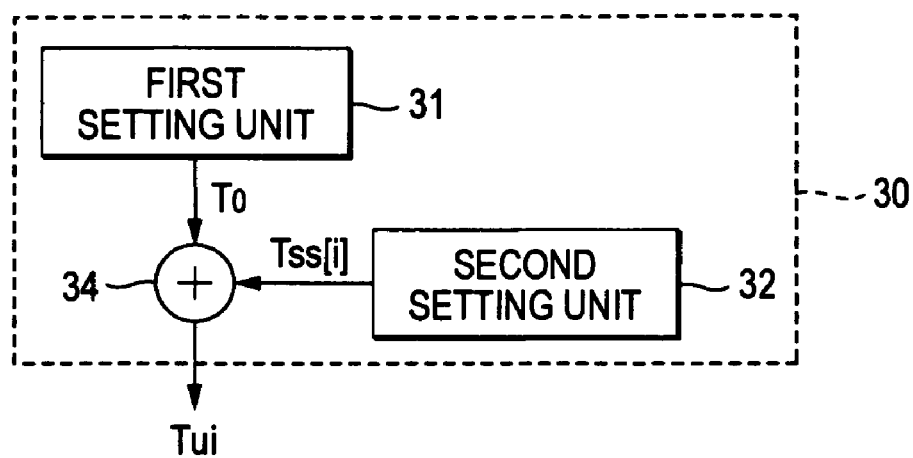
FIG. 3 is a block diagram for showing an arrangement of a time period control unit shown in FIG. 1.

The time period control unit 30 controls a time length "TUi (i=1, 2, - - - )" of each of unit terms "Ui" in a variable manner. FIG. 3 is a block diagram for representing a concrete structure of the time period control unit 30. As indicated in FIG. 3, the time period control unit 30 is arranged by a first setting unit 31, a second setting unit 32, and a calculating unit 34. The first setting unit 31 sets a basic value "T0". The basic value "T0" is a fixed value which is commonly set with respect to a plurality of unit terms "U". On the other hand, the second setting unit 32 sets a spread coefficient "TSS (TSS[1], TSS[2], - - - )" in a variable manner every unit term "U". For instance, the second setting unit 32 controls the spread coefficient "TSS" of each of the unit terms "U" in a variable manner in such a manner that predetermined pieces of the unit terms "U" are changed as a time period. Preferably, a random number generator for generating a random number as the spread coefficient "TSS" within a predetermined range is employed as the second setting unit 32. The calculating unit 34 calculates a time length "TUi" of the unit term "Ui" based upon the basic value T0 and the spread coefficient "TSS[i]". The calculating unit 34 of the first embodiment corresponds to such an adder which calculates an added value between the basic value "T0" and the spread coefficient "TSS[i]" as a time length "TUi (TUi=T0+TSS[i])".

Figure 4:
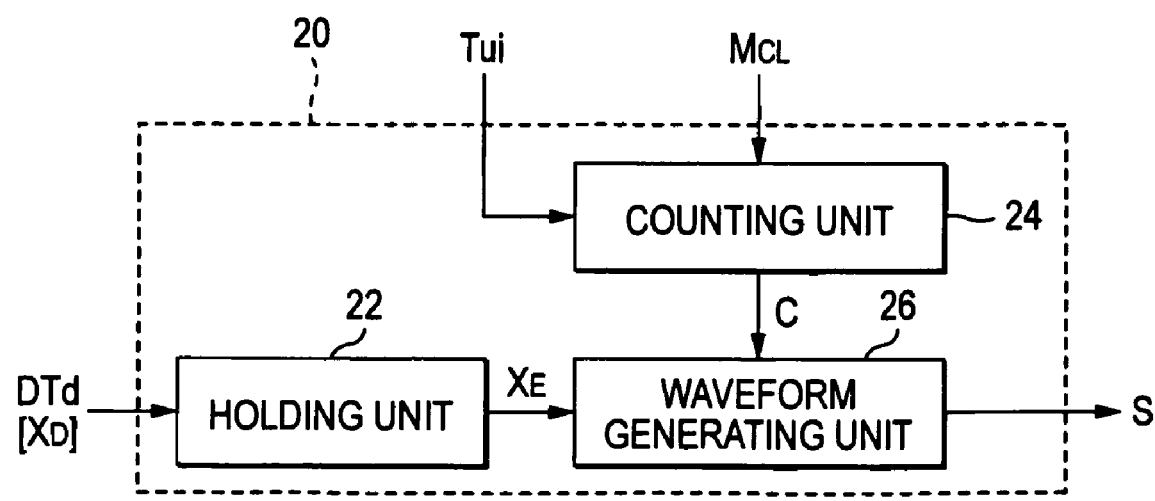
FIG. 4 is a block diagram for representing an arrangement of a pulse-width modulating unit shown in FIG. 1.

Next, FIG. 4 is a block diagram for exemplifying a concrete structure of the above-described pulse-width modulating unit 20. As shown in FIG. 4, the pulse-width modulating unit 20 is equipped with a holding unit 22, a counting unit 24, and a waveform generating unit 26. The holding unit 22 holds the respective data "XD" of the data series "DTd" supplied from the noise shaping filter 16 every unit term "U" as data "XE (XE[1], XE[2], - - - )". For example, as shown in FIG. 2, such a latch circuit may be preferably employed as the holding unit 22, while the latch circuit latches the data "XD" at a starting point of the unit term "Ui", and also, holds this latched output (data XE[i]) until an end point of this unit term "Ui".

The counting unit 24 of FIG. 4 generates a count value "C" which is changed during each of the unit terms "U". Such a counter circuit for counting a master clock "MCL" having a predetermined time period is preferably employed as the counting unit 24. As shown in FIG. 2, a count value "C" is initialized to become zero at a starting point of the unit term "U"; the count value "C" is increased in a linear mode within a section defined from the above-described starting point up to a center point "tc" of the unit term "U", while this center point "tc" implies such a time point for dividing the time length "TU" of the unit term "U" by 2; and after the center point, the count value "C" is decreased in a linear mode, and is reached again to zero at an end point of the unit term "U". Since the time period of the above-described master clock "MCL" is fixed, a maximum value of the count value "C" is changed in response to the time length "TU" of the unit term "U".

The waveform generating unit 26 of FIG. 4 arranges a pules "P" every unit term "U" so as to generate a pulse-width modulation signal "S", while a pulse width of the pulse "P" has been set in response to the data "XE" held by the holding unit 22 and the count value "C" outputted by the counting unit 24. As indicated in FIG. 2, the waveform generating unit 26 of the first embodiment generates such a negative pulse that time points (namely, time points when count value "C" crosses over data "XE") when large/small portions of the data "XE" and the count value "C" are inverted are defined as a front edge and a rear edge. More precisely speaking, it is so assumed that the time point when the count value "C" exceeds the data "XE[i]" within the front half section of the unit term "Ui" is defined as the front edge (rising time point from high level to low level) of the pulse "P", whereas the time point when the count value "C" becomes below the data "XE[i]" within the rear half section of the unit term "Ui" is defined as the rear edge (falling time point from low level to high level) of the pulse "P". As a consequence, during the respective unit terms "U" whose time lengths "TU" are equal to each other, the larger the data "XE" held by the holding unit 22 becomes, the smaller the pulse width of the pulse "P" becomes.

As previously described, the time length "TU" is changed every unit term "U". As a consequence, assuming now that the respective data "XB" of the data series "DTb" are supplied to the noise shaping filter 16 as the data "XC" of the data series "DTc" while these data "XB" remain unprocessed, even in such a case that the data "XB" are commonly supplied over a plurality of unit terms "U", a duty ratio of the pulse-width modulation signal "S" is changed every unit term "U". The duty ratio of the pulse-width modulation signal "S" implies a relative ratio of the pulse width of the pulse "P" with respect to the time length "TU" of the unit term "U". In other words, the longer the time length "TU" becomes, the higher the duty ratio is increased. As a result, there is such a problem that the sound waveform indicative of the data series "DTa" is different from the sound waveform regenerated by the load circuit 55, namely, the waveform is distorted.

The correcting unit 14 of FIG. 1 corrects the respective data "XB" of the data series "DTb" in such a manner that a difference contained in duty ratios of the pulse-width modulation signals "S" can be compensated, while the difference of these duty ratios is caused by a change in the time lengths "TU" of the respective unit terms "U" so as to generate a data series "DTc". In other words, the compensation of the duty ratio difference implies that the duty ratios become equal to each other in the respective unit terms "U" which are common to the data "X" before being corrected.

As shown in FIG. 1, the correcting unit 14 contains a correction value calculating unit 142 and a correction calculating unit 144. The correction value calculating unit 142 sets a correction value "Gi" every unit term "U" based upon a time length "TUi" in a variable manner, while the above-described time length "TUi" has been set by the time period control unit 30 with respect to the unit term "Ui". The correction calculating unit 144 corrects data "XB (will be expressed as "XB (i)" hereinafter) based upon the correction value "Gi" determined by the correction value calculating unit 142 as to the unit term "Ui". The data "XB" corresponds to the data "XD" acquired by the holding unit 22 in the unit term "Ui" among the data series "DTb." It should be understood that the correction calculating unit 144 of the first embodiment is such a multiplier which multiplies the data "XB[i]" by the correction value "Gi" and defines the multiplied value "Gi·XB[i]" as data "XC" of the data series "DTc".

Assuming now that the data "XC" is not changed before and after the filtering process operation by the noise shaping filter 16 is carried out, the data "XE[i]" held by the holding unit 22 in the unit term "Ui" becomes a multiplied value (XE=Gi·XB) between the correction value "Gi" and the data "XB[i]". Since the unit length "TUi" of the unit term "Ui" corresponds to an added value between the base value "T0" and the spread coefficient TSS[i], a duty ratio "Di" of the pulse-width modulation signal "S" in the unit term "Ui" may be calculated based upon the below-mentioned formula (1):

$$Di=(Gi \cdot XB[i])/(T0+TSS[i]) \qquad (1)$$

The correction value calculating unit 142 determines the correction value "Gi" in such a manner that the duty ratio "Di" in such a case where the data "XB[i]" will be corrected based upon the above-described correction value "Gi" may be approximated to a reference value "D0" in response to the data "XB[i]" (ideally speaking, duty ratio "Di" is made coincident with reference value "D0"). The above-described reference value "D0" is equal to such a duty ratio (D0=XB[i]/T0) of the pulse-width modulation signal "S" which is generated when it is so assumed that the data XB[i] before being corrected (has not yet corrected) during the unit term "Ui" has been held in the holding unit 22. The time length "TU" of the above-described unit term "Ui" has been set to the base value "T0". From such a condition that the duty ratio "Di" is made coincident with the base value "D0", the below-mentioned formula (2) may be conducted:

$$(Gi \cdot XB[i])/(T0+TSS[i])=XB[i]/T0 \text{ Namely, } Gi=(T0+TSS[i])/T0 \qquad (2)$$

As expressed in the above-described of formula (2), the correction value "Gi" is equal to such a numeral value calculated by dividing the time length "TUi (TUi=T0+TSS[i])" determined by the time period control unit 30 by the base value "T0". As a consequence, as shown in FIG. 1, such a multiplier for multiplying an inverse number of the base value "T0" with respect to the time length "TUi" may be suitably employed as the correction value calculating unit 142.

As previously described, in the first embodiment, since the time length "TU" equivalent to the time period of the pulse-width modulation signal "S" is changed every unit term "U", the frequency component of the pulse-width modulation signal "S" may be spread (dispersed) over the wide frequency range, as compared with the arrangement in which the time period of the pulse-width modulation signal "S" is fixed. As a consequence, the electro magnetic interference (EM1) caused by the pulse-width modulation signal "S" can be suppressed. Also, the respective data "XB[i]" of the data series "DTb" are corrected based upon the correction value "Gi" set every unit term "U" in response to the time length "TU." As a result, even when the time length "TU" is changed every unit term "U", the respective data "XA" of the data series "DTa" and the duty ratios of the pulse-width modulation signal "S" are maintained in a predetermined relationship. As a consequence, the differences between the sound waveforms expressed by the data series "DTa", and the sound waveforms which are actually regenerated from the load circuit 55 can be suppressed.

B: Second Embodiment

Next, a description is made of a second embodiment of the present invention. It should be understood that the same reference numerals shown in the first embodiment will be employed as those for denoting the same, or similar operations and functions thereof in the second embodiment, and detailed descriptions thereof will be properly omitted.

In the first embodiment, in such a case that the changing time period of the time length "TU" of the unit term "U" is short and the changing width of the time length "TU" is small, the respective data "XD" of the data series "DTd" can be sequentially held by the holding unit 22 every unit term "U". However, in such a case that a changing period of the time length "TU" is long and a changing width of the time length "TU" is large, there are some possibilities that a shift between the unit term "U" and each of the data "XD" of the data series "DTd" on the time axis is enlarged in an elapse of time, so that the single data "XD" is held in the holding unit 22 in a duplicated manner over a plurality of unit terms "U". The above-described problem will now be explained with reference to FIG. 5.

Figure 5:
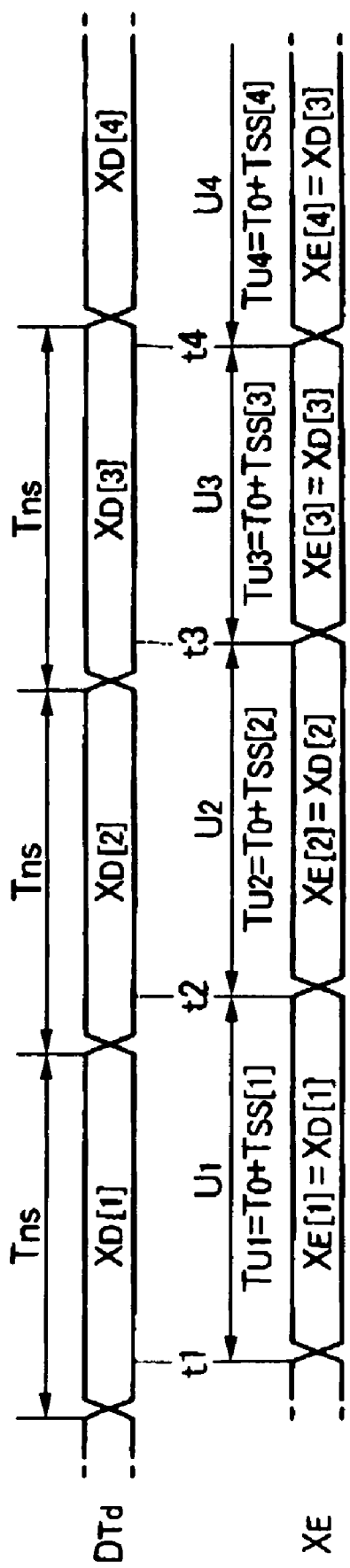
FIG. 5 is a timing chart for indicating data holding operation by a holding unit of the first embodiment.

As shown in FIG. 5, the respective data XD (XD[1], XD[2], - - -) of the data series "DTd" outputted from the noise shaping filter 16 are held in the holding unit 22 as data XE (XE[1], XE[2], - - -) at a starting point "ti" of each of the unit terms "Ui". As indicated in FIG. 5, when the unit term "U" of the time length "TU" which is shorter than the sampling time period "Tns" of the data series "DTd" is continued over a plurality of the unit terms "U", timing when the holding unit 22 acquires the data "XD" is moved to the forward side in view of a temporal aspect with respect to the time point when the data "XD" in the data series "DTd" are switched. As a consequence, at a starting point "t4" of the unit term "U4" shown in FIG. 5, although data "XD[4]" of the data series "DTd" should be originally held in the holding unit 22 as the data "XE[4]", the same data "XD[3]" as the unit term "U3" just before the above-described unit term "U4" are held in the holding unit 22 in a duplicated manner. As a consequence, there are some possibilities that the sound waveforms indicated by the data series "DTa" are different from sound waveforms regenerated by the load circuit 55. In order to solve the above-described problem, the signal generating apparatus 10 of the second embodiment causes the switching time points (sampling time period) of the data "XB" in the data series "DTb" to be synchronized with the unit term "U".

Figure 6:
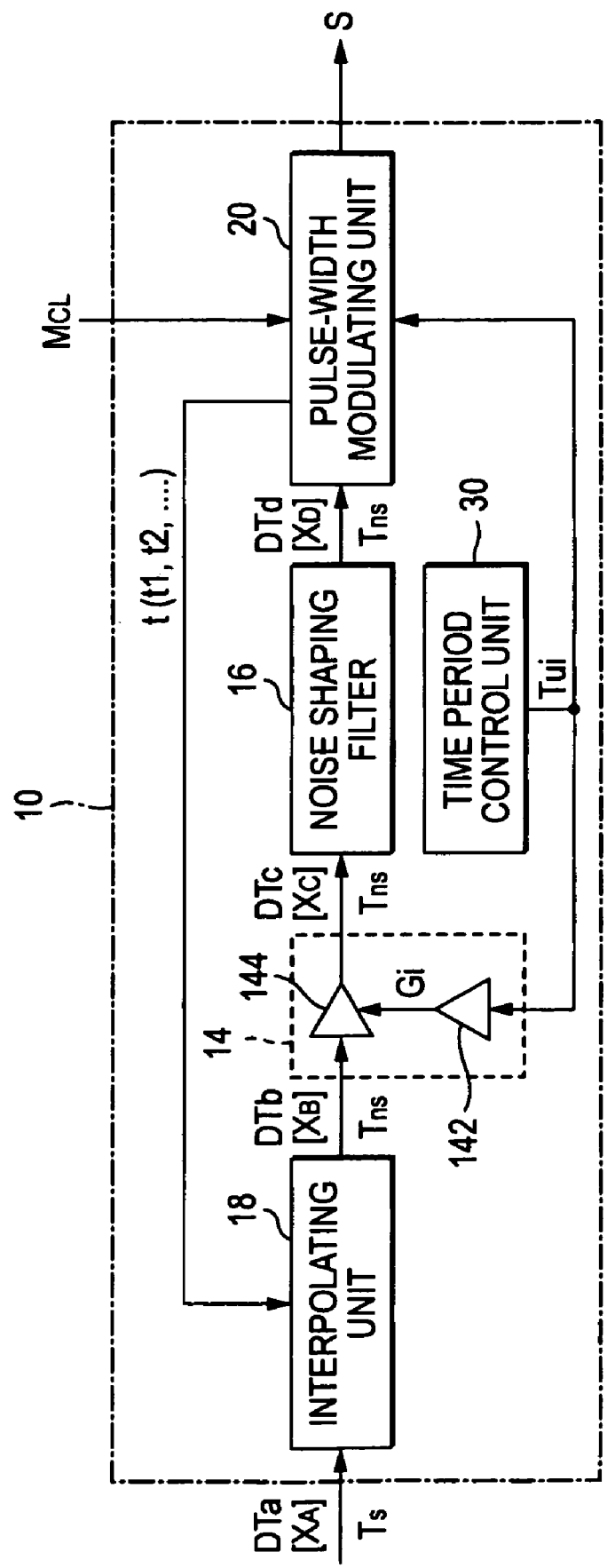
FIG. 6 is a block diagram for showing an arrangement of a signal generating apparatus according to a second embodiment of the present invention.

FIG. 6 is a block diagram for showing an arrangement of the signal generating apparatus 10. As indicated in this drawing, the signal generating apparatus 10 of the second embodiment is arranged by substituting the oversampling unit 12 provided in the first embodiment by an interpolating unit 18. Time points "t (t1, t2, t3, - - -)" which are synchronized with the respective unit terms "U" are designated from the pulse-width modulating unit 20 to the interpolating unit 18. In the second embodiment, the starting time of the unit term "Ui" is designated as a time point "ti" to the interpolating unit 18.

Figure 7:
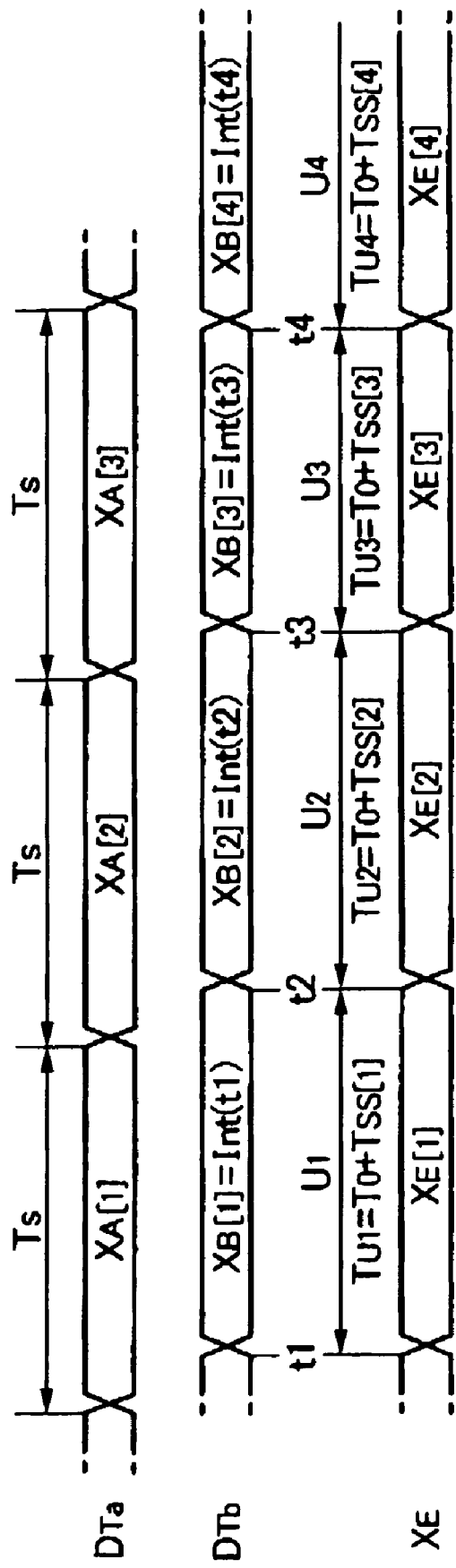
FIG. 7 is a timing chart for describing operation of the signal generating apparatus of FIG. 6.

FIG. 7 is a timing chart for explaining operations of the signal generating apparatus 10. As shown in FIG. 7, the interpolating unit 18 interpolates the respective data "XA" arrayed every sampling period "Ts" in the data series "DTa" so as to generate data "XB (XB[1], XB[2], - - -)" in the respective time points "t (t1, t2, - - -)" within the waveforms represented by the data series "DTa". Symbol "Int(ti)" indicated in FIG. 7 implies an interpolating process operation for calculating an amplitude value at a time point "ti" within the waveforms represented by the data series "DTa". The array of the data XB generated by the interpolating unit 18 every unit term "U" is outputted as the data series "DTb" to the correcting unit 14. As a consequence, as shown in FIG. 7, the respective data "XB" of the data series "DTb" are synchronized with the unit terms "U" whose time lengths "TU" have been set by the time period control unit 30.

An FIR (Finite Impulse Response) filter which individually multiplies a coefficient with respect to each of predetermined numbers of the above-described data "XA" in the data series "DTa", and thereafter, accumulates these multiplied data is preferably employed as the interpolating unit 18. It should also be noted that the oversampling unit 12 in the first embodiment corresponds to such a means for interpolating the sound waveform indicated by the data series "DTa" in the time period "Tns" which is shorter than the sampling time period "Ts" of the data "XA". In other words, the essential operations and functions of both the oversampling unit 12 of the first embodiment and the interpolating unit 18 of the second embodiment are common to each other.

The arrangements of the second embodiment except for the interpolating unit 18 are similar to those of the first embodiment. A data series "DTd" is supplied from the noise shaping filter 16 to the pulse-width modulating unit 20, while the data series "DTd" is generated by that data "XD (XD[1], XD[2], - - -)" corresponding to the respective data "XB" of the data series "DTb" have been arrayed in the same interval as that of the data series "DTb." As shown in FIG. 7, the holding unit 22 of the pulse-width modulating unit 20 holds the data XD[i] of the data series "DTd" as data "XE[i]" at the starting point "ti" of the unit term "Ui".

As previously described, in the second embodiment, the data "XB[i]" equivalent to the amplitude value at the starting time "ti" of each of the unit terms "Ui" among the sound waveforms indicated by the data series "DTa" is generated by interpolating each of the data "XA." As a result, such an erroneous operation does not occur in principle, in which the holding unit 22 acquires one data "XD" of the data series "DTd" in the duplicated manner during a plurality of unit terms "U". As a consequence, the pulse-width modulation signal "S" capable of regenerating the sound waveforms indicated by the data series DTa in the high precision by the load circuit 55 can be generated (namely, difference between sound waveform indicative of data series DTa and sound waveform regenerated by the load circuit 55 can be reduced).

It should also be noted that in the first embodiment, the holding unit 22 holds the respective data "XD" of the relevant data series "DTd" as the data "XE" every unit term "U" which is not synchronized with respect to the sampling time period "Tns" of the data series "DTd". As a consequence, even in such a case that the data "XD" acquired by the holding unit 22 are not duplicated with each other over the plurality of unit terms "U", there is such a difference between the sound waveforms indicated by the time sequence of the data "XE" held by the holding unit 22, and the sound waveforms (sound waveforms indicated by data series DTa) indicated by the data series "DTd" supplied to the holding unit 22. In accordance with this second embodiment, since the data "XB" synchronized with the unit term "U" are generated by the interpolating unit 18, the sound waveforms indicated by the data series "DTa" can be made coincident with the sound waveforms indicated by the time sequence of the data "XE" held in the holding unit 22 in high precision. As a consequence, even in such a case that the changing time period and the changing width of the time length "TU" of the unit term "U" have been set within such a range that the data "XD" held in the holding unit 22 are not duplicated with each other, this second embodiment becomes effective in order to achieve such an object that the sound waveforms of the data series "DTa" are regenerated in high precision.

C: Modifications

It should be understood that the above-described respective embodiments may be modified in various manners. Concrete modified modes are exemplified in the below-mentioned items. It should also be noted that the below-exemplified modifications may be alternatively combined with each other.

(1) Modification 1

Although the random number generator has been employed as the second setting unit 32 of the time period control unit 30 in the above-described respective modes, concrete arrangements for controlling the time length "TU" every unit period "U" in a variable manner may be alternatively changed in a proper manner. For instance, such a counter circuit may be alternatively employed as the second setting unit 32, while the counter circuit sequentially increments (otherwise, decrements) a count value in a predetermined time period, and initializes the count value every time a predetermined number of unit terms "U" have elapsed. The time length "TU" of the respective unit terms "U" is sequentially increased (otherwise, decreased), while the predetermined number of unit terms "U" are defined as a time period. If the arrangement in which the time length "TU" of the unit term "U" is changed in the above-described manner is employed, then the frequency component of the pulse-width modulation signal "S" is spread over the wide frequency range irrespective of the changing mode of the time length "TU", as compared with the arrangement in which the time length of the unit term "U" has been fixed. As a result, it is possible to alternatively achieve such a predetermined effect that the electro magnetic interference caused by the pulse-width modulation signal "S" is suppressed. Also, the first setting unit 31 for setting the base value "T0" is not necessarily required in the above-described respective embodiments. For instance, it is also possible to employ such an arrangement that the spread coefficient TSS[i] which has been variably set by the second setting unit 32 is designated as the time length "TUi" to the pulse-width modulating unit 20, and the correcting unit 14.

(2) Modification 2

In such a case that a change in duty ratios of the pulse-width modulation signal "S" caused by a change in the time lengths "TU" of the unit terms "U" does not constitute a specific problem in actual operations (reproduction of sounds), the correcting unit 14 may be alternatively omitted. Even in such a case that a distortion of sounds (namely, difference between sounds indicated by data series DTa and sounds outputted from load circuit 55) outputted from the load circuit 55 causes the time length "TU" of the unit term "U" to be changed with a changing width which cannot be audibly sensed, if the electro magnetic interference caused by the pulse-width modulation signal "S" may be suppressed in a proper degree, then the correcting unit 14 may be alternatively omitted, so that the arrangement of the signal generating apparatus 10 may be made simpler.

(3) Modification 3

In such an arrangement that all of the coefficients of the FIR filter employed as the interpolating unit 18 of the second embodiment are stored in the signal generating apparatus, it is required to employ a storage apparatus having a large capacity so as to store thereinto these coefficients. As a consequence, such an arrangement for calculating a plurality of coefficients used in the FIR filter in an interpolation manner may be suitably employed. That is, while only preselected number of coefficients selected from a large number of coefficients used in the FIR filter are stored in the storage apparatus, the interpolating unit 18 interpolates all of the coefficients of the FIR filter based upon the respective coefficients stored in the storage apparatus. In other words, the interpolating unit 18 executes plural sets of interpolations, namely, the interpolation of the coefficients and the interpolation of the data "XB." In accordance with the above-described arrangement, there is such a merit that the capacity of the storage apparatus for holding the coefficients of the FIR filter may be reduced. In fact, the above-described FIR filter may merely constitute an exemplification of the interpolating unit 18. In other words, such an arbitrary means may be alternatively employed as the interpolating unit 18, while the arbitrary means may interpolate the data "XB[i]" of the time point "ti" designated from the pulse-width modulating unit 20 based upon a plurality of data "XA" of the data series "DTa".

(4) Modification 4

In the above-described respective embodiments, the respective pulses "P" of the pulse-width modulation signals "S" have been selected as the negative pulses (negative polarity pulses). Alternatively, another arrangement in which the pulse "P" is selected as a positive pulse (positive polarity pulse) may be employed. The polarity of the pulse "P" may be properly selected in correspondence with the arrangement of the driving apparatus 50.

What is claimed is:

1. A signal generating apparatus comprising:
   a time period controller which variably controls a time length of each of unit terms;
   a counter which changes a count value during each of the unit terms;
   a holding unit which holds each of plural data every the unit term, the plural data being sequentially supplied; and
   a waveform generator which generates a pulse-width modulation signal such that a pulse in which a time point when a large/small relationship between the count value and a numeral value of the data held in the holding unit is inverted is defined as an edge portion of the pulse is arranged every the unit term.

2. The signal generating apparatus according to claim 1 further comprising:
   a correcting unit which corrects each of the plural data in such a manner that a duty ratio of the pulse-width modulation signal generated in response to the data after being corrected in each of the unit terms is appropriated to a duty ratio generated in response to data before being corrected during a unit term having a predetermined time length,
   wherein the holding unit holds the respective data corrected by the correcting unit.

3. The signal generating apparatus according to claim 2, wherein the time period controller includes:
   a first setting unit which sets a base value which is commonly used with respect to each of the unit terms;
   a second setting unit which variably sets a spread coefficient every the unit term; and a calculator which calculates the time length of each of the unit terms based upon an added value between the base value and the spread coefficient, and wherein the correcting unit includes:

a correction value calculator which calculates a relative ratio of the time length of the unit term with respect to the base value as a correction value of the unit term; and a correction calculator which multiplies each of the plural data by the correction value.

4. The signal generating apparatus according to claim 3, wherein the second setting unit includes a random number generator for generating a random number as the spread coefficient.

5. The signal generating apparatus according to claim 1 further comprising an interpolating unit for calculating data at a starting point of each of the unit terms by an interpolation manner, wherein the holding unit holds the data after being interpolated by the interpolating unit.

6. A class-D amplifying apparatus comprising:

a time period controller which variably controls a time length of each of unit terms;

a counter which changes a count value during each of the unit terms;

a holding unit which holds each of plural data every the unit term, the plural data being sequentially supplied; and a waveform generator which generates a pulse-width modulation signal such that a pulse in which a time point when a large/small relationship between the count value and a numeral value of the data held in the holding unit is inverted is defined as an edge portion of the pulse is arranged every the unit term; and a driver which controls a supply of electric power with respect to a load circuit in response to the pulse-width modulation signal.

* * * * *